US009098391B2

(12) United States Patent
Yoo et al.

(10) Patent No.: US 9,098,391 B2
(45) Date of Patent: Aug. 4, 2015

(54) MEMORY SYSTEM AND METHOD OF OPERATING MEMORY SYSTEM USING RECONSTRUCTED DATA

(71) Applicant: SAMSUNG ELECTRONICS CO., LTD., Suwon-Si, Gyeonggi-Do (KR)

(72) Inventors: Hyun-Seuk Yoo, Hwaseong-Si (KR); Jun-Jin Kong, Yongin-Si (KR); Chang-Kyu Seol, Osan-Si (KR); Hong-Rak Son, Anyang-Si (KR); Young-Geon Yoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 14/052,834

(22) Filed: Oct. 14, 2013

(65) Prior Publication Data

US 2014/0115424 A1 Apr. 24, 2014

(30) Foreign Application Priority Data

Oct. 22, 2012 (KR) ........................ 10-2012-0117371

(51) Int. Cl.
*G06F 12/00* (2006.01)
*G06F 11/10* (2006.01)
*G11C 16/34* (2006.01)
*G11C 11/56* (2006.01)
*G11C 16/16* (2006.01)
*G11C 29/00* (2006.01)
*G11C 16/12* (2006.01)
*G11C 16/10* (2006.01)

(52) U.S. Cl.
CPC ................ *G06F 12/00* (2013.01); *G06F 11/10* (2013.01); *G06F 11/1048* (2013.01); *G11C 11/5628* (2013.01); *G11C 16/10* (2013.01); *G11C 16/12* (2013.01); *G11C 16/16* (2013.01); *G11C 16/3427* (2013.01); *G11C 16/3454* (2013.01); *G11C 29/00* (2013.01); *G11C 2211/5648* (2013.01)

(58) Field of Classification Search
CPC ..... G06F 12/00; G06F 11/10; G06F 11/1048; G11C 16/3454; G11C 11/5628; G11C 16/10; G11C 16/12; G11C 16/16; G11C 29/00; G11C 2211/5648; G11C 16/3427
USPC .......................... 714/763, 768, 773, 780, 799; 365/185.03, 185.09, 185.22; 711/100, 711/102, 103, 147, 154
See application file for complete search history.

(56) References Cited

U.S. PATENT DOCUMENTS 6,046,936 A * 4/2000 Tsujikawa et al. ........ 365/185.03
6,333,871 B1 * 12/2001 Tsujikawa et al. ........ 365/185.28
7,315,477 B2 1/2008 Chen (Continued)

*Primary Examiner* — John J Tabone, Jr.
(74) *Attorney, Agent, or Firm* — Volentine & Whitt, PLLC

(57) ABSTRACT

Provided is a method of operating a memory system. The method includes programming first bit data into multiple memory cells; identifying target memory cells that are in a first state and have threshold voltages equal to or greater than a first voltage from the memory cells programmed with the first bit data; receiving second bit data which is to be programmed into the memory cells; calculating multiple third bit data by performing a first process on the second bit data; and selecting third bit data of the calculated multiple third bit data that changes a largest number of target memory cells from the first state to a second state when the memory cells are programmed with each of the multiple third bit data, respectively. The selected third bit data is programmed into the memory cells.

20 Claims, 11 Drawing Sheets

(56) References Cited

U.S. PATENT DOCUMENTS

| | | | |
|---|---|---|---|
| 7,336,538 B2* | 2/2008 | Crippa et al. | 365/185.12 |
| 7,366,014 B2* | 4/2008 | Micheloni et al. | 365/185.03 |
| 7,499,332 B2* | 3/2009 | Crippa et al. | 365/185.22 |
| 7,518,923 B2 | 4/2009 | Mokhlesi | |
| 7,663,914 B2 | 2/2010 | Lee | |
| 7,701,775 B2* | 4/2010 | Kang | 365/185.21 |
| 7,903,467 B2 | 3/2011 | Lee | |
| 7,904,793 B2* | 3/2011 | Mokhlesi et al. | 714/780 |
| 7,990,765 B2* | 8/2011 | Park et al. | 365/185.03 |
| 8,331,145 B2* | 12/2012 | Kang | 365/185.03 |
| 8,514,621 B2* | 8/2013 | Choi et al. | 365/185.03 |
| 8,996,947 B2* | 3/2015 | Chung et al. | 714/752 |
| 2005/0007801 A1* | 1/2005 | Barzilai et al. | 365/10 |
| 2007/0030732 A1* | 2/2007 | Micheloni et al. | 365/185.03 |
| 2007/0121378 A1* | 5/2007 | Shibata et al. | 365/185.03 |
| 2007/0153574 A1* | 7/2007 | Kouno | 365/185.03 |
| 2008/0101116 A1* | 5/2008 | Seong et al. | 365/185.03 |
| 2008/0259686 A1* | 10/2008 | Hwang | 365/185.03 |
| 2009/0073762 A1* | 3/2009 | Lee et al. | 365/185.03 |
| 2009/0285023 A1* | 11/2009 | Cho et al. | 365/185.03 |
| 2009/0296467 A1* | 12/2009 | Kim et al. | 365/185.03 |
| 2010/0074012 A1* | 3/2010 | Park et al. | 365/185.03 |
| 2010/0195389 A1* | 8/2010 | Kim et al. | 365/185.03 |
| 2010/0223530 A1* | 9/2010 | Son et al. | 714/763 |
| 2010/0321999 A1* | 12/2010 | Yoo et al. | 365/185.03 |
| 2011/0032759 A1 | 2/2011 | Kim et al. | |
| 2011/0317488 A1 | 12/2011 | Tseng et al. | |
| 2012/0020156 A1* | 1/2012 | Choi et al. | 365/185.03 |
| 2012/0147669 A1* | 6/2012 | Byeon | 365/185.03 |
| 2012/0163079 A1* | 6/2012 | Shalvi et al. | 365/185.03 |
| 2012/0170364 A1* | 7/2012 | Jang et al. | 365/185.03 |
| 2013/0088923 A1* | 4/2013 | Kang | 365/185.19 |
| 2013/0132644 A1* | 5/2013 | Choi et al. | 711/103 |
| 2013/0141970 A1* | 6/2013 | Shibata | 365/185.02 |
| 2013/0246720 A1* | 9/2013 | Mokhlesi et al. | 711/154 |
| 2014/0059406 A1* | 2/2014 | Hyun et al. | 714/773 |
| 2014/0247657 A1* | 9/2014 | Jang et al. | 365/185.03 |

* cited by examiner

MEMORY SYSTEM AND METHOD OF OPERATING MEMORY SYSTEM USING RECONSTRUCTED DATA

A claim for priority under 35 U.S.C. §119 is made to Korean Patent Application No. 10-2012-0117371 filed on Oct. 22, 2012, in the Korean Intellectual Property Office, the entire contents of which are hereby incorporated by reference.

BACKGROUND

The inventive concept relates to a method of operating a memory device and memory system.

Memory devices are classified as volatile memory devices and nonvolatile memory devices. Volatile memory devices lose stored data when the power supply is turned off, or otherwise interrupted. Examples of volatile memory devices include static random access memory (SRAM) devices, dynamic random access memory (DRAM) devices, and synchronous dynamic random access memory (SDRAM) devices.

Nonvolatile memory devices retain stored data even when the power supply is interrupted. Examples of nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, and resistive memory devices (e.g., phase-change random access memory (PRAM) devices, ferroelectric random access memory (FRAM) devices, and resistive random access memory (RRAM) devices).

A flash memory device may perform an electric erase operation on a block-by-block basis and a program operation on a bit-by-bit basis. Threshold voltages of programmed memory cells included in a flash memory device may change due to various causes, including floating gate coupling and charge loss over time. Changes in the threshold voltages of the memory cells can undermine the reliability of read data.

SUMMARY

Aspects of the inventive concept provide a method of operating a memory device, the method being employed to improve the reliability of read data. Aspects of the inventive concept also provide a memory system which improves the reliability of read data.

However, aspects of the inventive concept are not restricted to those set forth herein. The above and other aspects of the inventive concept will become more apparent to one of ordinary skill in the art to which the inventive concept pertains by referencing the detailed description below.

According to an aspect of the inventive concept, there is provided a method of operating a memory device. The method includes programming first bit data into multiple memory cells; identifying target memory cells that are in a first state and have threshold voltages equal to or greater than a first voltage from the memory cells programmed with the first bit data; receiving second bit data which is to be programmed into the memory cells; calculating a plurality of third bit data by performing a first process on the second bit data; and selecting third bit data of the calculated plurality of third bit data that changes a largest number of target memory cells from the first state to a second state when the memory cells are programmed with each of the multiple third bit data, respectively. The selected third bit data is programmed into the memory cells.

According to another aspect of the inventive concept, there is provided a memory system including a nonvolatile memory device having a plurality of memory cells, an input/output (I/O) device configured to receive first bit data and second bit data which are to be programmed into the memory cells, and a controller configured to control the nonvolatile memory device. The nonvolatile memory device includes control logic configured to identify target memory cells from the memory cells programmed with the first bit data, the target memory cells being in a first state and having threshold voltages equal to or greater than a first voltage. The controller includes a read-only memory (ROM) configured to store a plurality of masks; a microprocessor configured to calculate a plurality of third bit data by performing a first operation on the second bit data with the plurality of masks, respectively; a random-access memory (RAM) configured to store the plurality of third bit data calculated by the microprocessor; and a counter configured to count the number of target memory cells which change from the first state to a second state when the memory cells are programmed with each of the plurality of third bit data, and to provide the counting results to the microprocessor. The microprocessor is further configured to select third bit data of the plurality of third bit data which produces a largest counting result, and to program the selected third bit data into the nonvolatile memory device.

According to another aspect of the inventive concept, there is provided a method of operating a memory device. The method includes programming first bit data into a plurality of memory cells; splitting the first bit data into a plurality of first data segments; identifying target memory cells that are in a first state and have threshold voltages equal to or greater than a first voltage from the plurality of memory cells programmed with the first data segments; receiving second bit data which is to be programmed into the plurality of memory cells; splitting the second bit data into a plurality of second data segments; calculating a plurality of third data segments for each of the plurality of second data segments by performing a first process on the corresponding second data segment; selecting a third data segment of the plurality of third data segments that changes a largest number of target memory cells from the first state to a second state within each of the plurality of second data segments, respectively, to provide a plurality of selected third data segments; combining the plurality of selected third data segments into third bit data; and programming the third bit data into the plurality of memory cells.

BRIEF DESCRIPTION OF THE DRAWINGS

The above and other aspects and features of the inventive concept will become more apparent by describing in detail exemplary embodiments thereof with reference to the attached drawings.

DETAILED DESCRIPTION OF THE EMBODIMENTS

Figure 1:
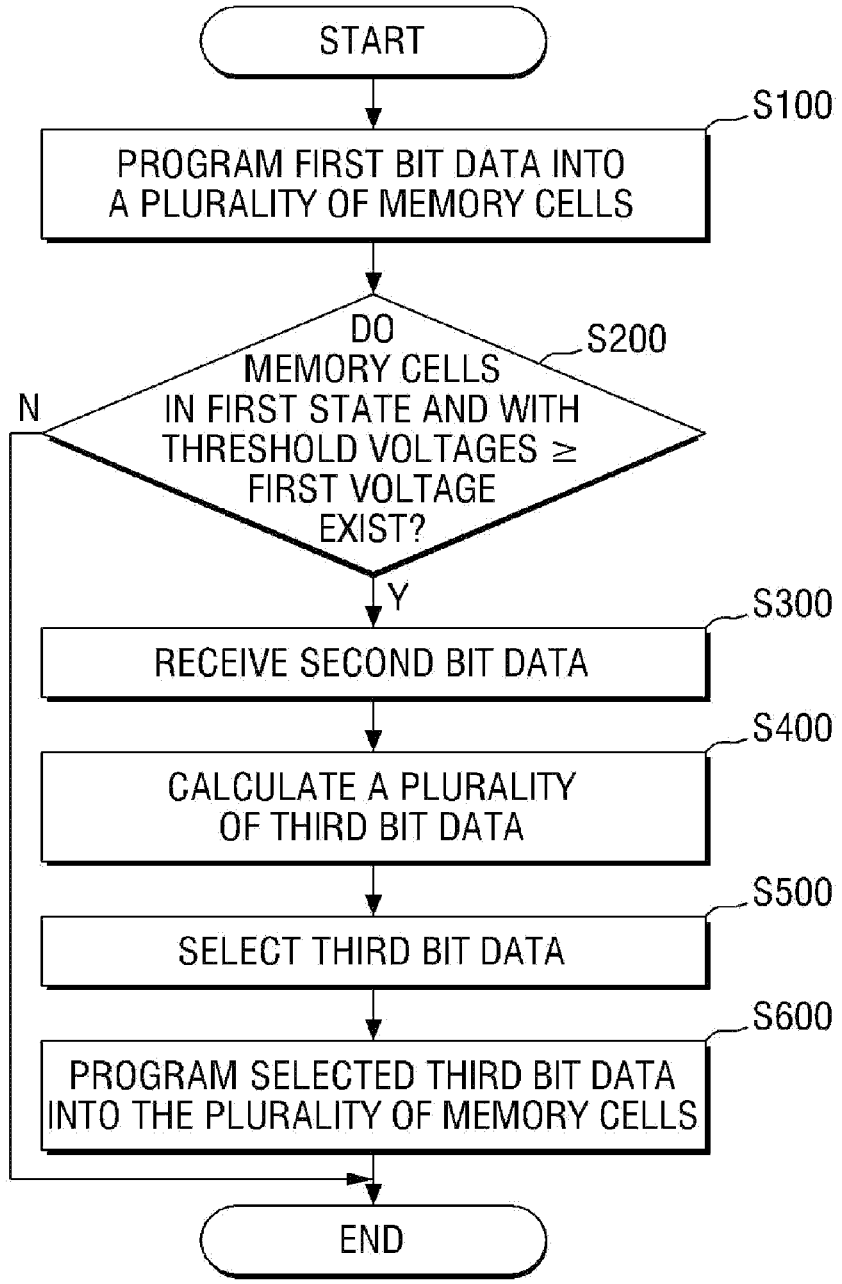
FIG. 1 is a flowchart illustrating a method of operating a memory system, according to an embodiment of the inventive concept.

The inventive concept will now be described more fully with reference to the following detailed description and accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the concept of the inventive concept to one of ordinary skill in the art. Thus, in some embodiments, well-known methods, procedures, components, and circuitry have not been described in detail to avoid unnecessarily obscuring aspects of the present invention. In the drawings and specification, like reference numerals denote like elements throughout, and the sizes or thicknesses of layers and regions may be exaggerated for clarity.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will also be understood that when a layer or element is referred to as being "on" another layer or element, including substrate, it can be directly on the other layer or element, or intervening layers or elements may also be present. In contrast, when a layer or element is referred to as being "directly on" another layer or element, there are no intervening layers or elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc., may be used herein to describe various elements, these elements should not be limited by these terms. These terms are used to distinguish one element from another element. Thus, for example, a first element, a first component or a first section discussed below could be termed a second element, a second component or a second section without departing from the scope of the present teachings.

Unless defined otherwise, all technical and scientific terms used herein have the same meanings as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, terms defined in generally used dictionaries should not be overly interpreted.

The inventive concept will now be described more fully with reference to the accompanying drawings, in which exemplary embodiments concept are shown.

A method of operating a memory will now be described with reference to FIGS. 1 through 8.

Figure 2:
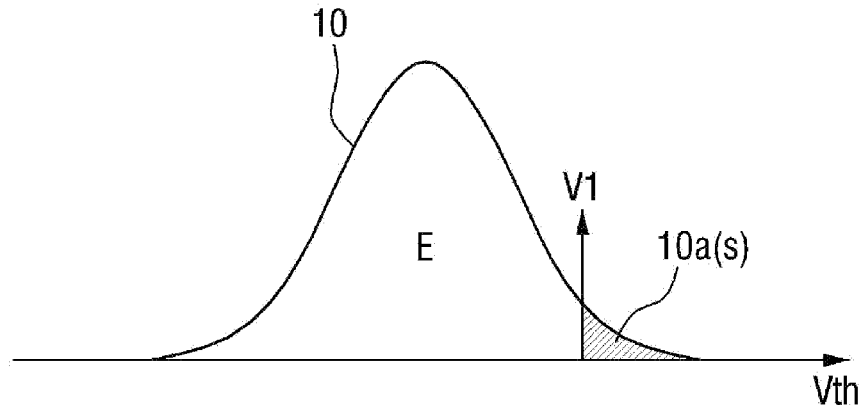
FIG. 2 is a diagram illustrating a process of identifying target memory cells having threshold voltages equal to or greater than a first voltage, according to an embodiment of the inventive concept.

FIG. 1 is a flowchart illustrating a method of operating a semiconductor memory, according to an embodiment of the inventive concept. FIG. 2 is a diagram illustrating a process of identifying target memory cells having threshold voltages equal to or greater than a first voltage.

Referring to FIG. 1, first bit data is programmed into a plurality of memory cells (operation S100). Each of the memory cells can store q bits (where q is a natural number). For example, three bits, i.e., a least significant bit (LSB), a central significant bit (CSB), and a most significant bit (MSB), may be programmed sequentially into each of the memory cells. However, the inventive concept is not limited thereto.

The first bit data may be bit data other than MSB data. For example, the first bit data may be LSB data or CSB data.

Referring again to FIG. 1, target memory cells are identified from among the memory cells programmed with the first bit data. That is, it is determined whether memory cells exist that are in a first state and have threshold voltages equal to or greater than a first voltage (operation S200). The target memory cells, which are the memory cells programmed with the first bit data that are in the first state and have threshold voltages equal to or greater than the first voltage V1, may be referred to as S memory cells.

Here, the first state may be an erase state E or a program state P. A multi-level cell (MLC) can have multiple program states. Thus, in the case of the MLC, the first state may denote a plurality of program states (e.g., P1, P2, P3, etc.) or the erase state E.

A threshold voltage distribution of the erase state E is wider than threshold voltage distributions of other program states. Therefore, in the erase state E, an error is more likely to occur during a program operation. Hence, if the first state is the erase state E, errors that may occur during a program operation generally can be reduced more significantly.

As mentioned above, target memory cells having threshold voltages equal to or greater than the first voltage are identified from the memory cells in the first state. For example, referring to FIG. 2, the x axis represents voltage, and the y axis represents the number of memory cells. A threshold voltage Vth of a memory cell is compared to a first voltage V1. If the threshold voltage Vth of the memory cell is equal to or greater than the first voltage V1, it is determined that the memory cell belongs to a first partial distribution 10a. The first partial distribution 10a may be part of an erase state distribution 10 as shown in FIG. 2. However, the inventive concept is not limited thereto. For example, the first partial distribution 10a can also be part of a program state distribution (e.g., P1, P2, P3, etc.). The first voltage V1 is not limited to a particular value and can be arbitrarily determined according to the characteristics and use of the memory.

Referring again FIG. 1, when it is determined in operation S200 that no memory cells are in the first state and have threshold voltages equal to or greater than the first voltage V1, operations S300 to S600 may be skipped and second bit data is simply programmed into the memory cells. However, when it is determined in operation S200 that one or more memory cells are in the first state and have a threshold voltage equal to or greater than the first voltage V1, the following process is performed to enable accurate reconstruction of the second bit data for subsequent programming into the memory cells.

The second bit data, which is data to be programmed into the memory cells after the first bit data, is received (operation S300). For example, if the first bit data is $q^{th}$ programmed data, the second bit data may be $(q+1)^{th}$ programmed data.

The second bit data may be the MSB data. The MSB data results in wider threshold voltage distributions than other data. In addition, since gaps between adjacent threshold voltage distributions are narrow in the case of the MSB data, the threshold voltage distributions may overlap each other. Therefore, if the second bit data is the MSB data, the error probability can be reduced more significantly by application of the depicted embodiment, as described in detail below.

A plurality of third bit data are then calculated by performing a first process (operation S400). The plurality of third bit data refers to at least two sets of third bit data, each set of third bit data being calculated separately using the first process and including the same number of bits as the other sets. For clarity, the multiple sets of third bit data may be collectively referred to as a plurality of third bit data, and each individual set of third bit data may be referred to simply as third bit data. The first process may calculate the third bit data using the received second bit data. For example, the first process may include performing a first operation, such as an exclusive or (XOR) operation, for example, on the received second bit data and a plurality of masks corresponding to the plurality of third bit data. The masks may have the same number of bits as the received second bit data. In various embodiments, the masks may be generated whenever the third bit data are calculated, or the masks may be predetermined. When the masks are predetermined, there is no need to generate the masks during a program operation, thus reducing programming time. While the number of masks is not fixed, the greater the number of masks (and thus the greater the number of third bit data) generally better serves the objective of the inventive concept, as described below.

One of the third bit data is then selected from among the calculated plurality of third bit data (S500). That is, the third bit data that results in the largest number of target memory cells (S memory cells) changing from the first state to a second state is selected. The selected third bit data is programmed into the memory cells (S600).

To determine the number of S memory cells that change from the first state to the second state, the number of S memory cells in the second state may be counted after performance of the first process for each of the plurality of third bit data. That is, if an S memory cell is in the second state, it means that the state of the S memory cell has been changed. In other words, the S memory cells in a state other than the first state are counted. For example, when the first state is an erase state, the second state may be a program state, and when the first state is a program state, the second state may be another program state.

Figure 3:
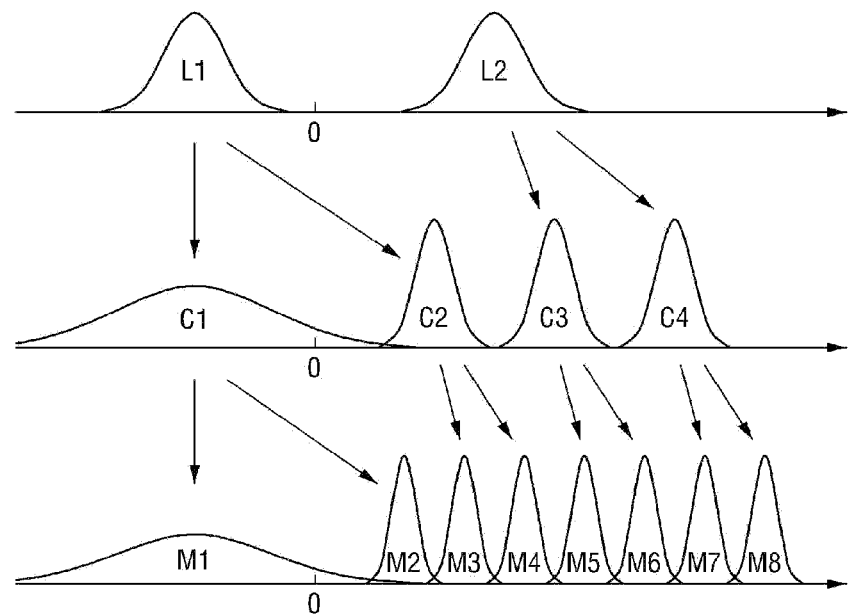
FIG. 3 is a diagram illustrating second states.

FIG. 3 is a diagram illustrating determination of a second state. Specifically, referring to FIG. 3, when the first bit data is the LSB data, the third bit data may represent the CSB data. The first bit data may be programmed to a first LSB state L1 or a second LSB state L2, and the third bit data may be programmed to first through fourth CSB states C1 through C4. Here, the first LSB state may be programmed to the first CSB state C1 or the second CSB state C2, and the second LSB state L2 may be programmed to the third CSB state C3 or the fourth CSB state C4. In this case, if the first state is the first LSB state L1, the second state may be the second CSB state C2, and if the first state is the second LSB state L2, the second state may be the fourth CSB state C4. Likewise, when the first bit data is the CSB data, the third bit data may represent the MSB data. If the first state is each one of the first through fourth CSB states C1 through C4, the second state may be each one of the second MSB state M2, the fourth MSB state M4, the sixth MSB state M6, and the eighth MSB state M8.

Figure 4:
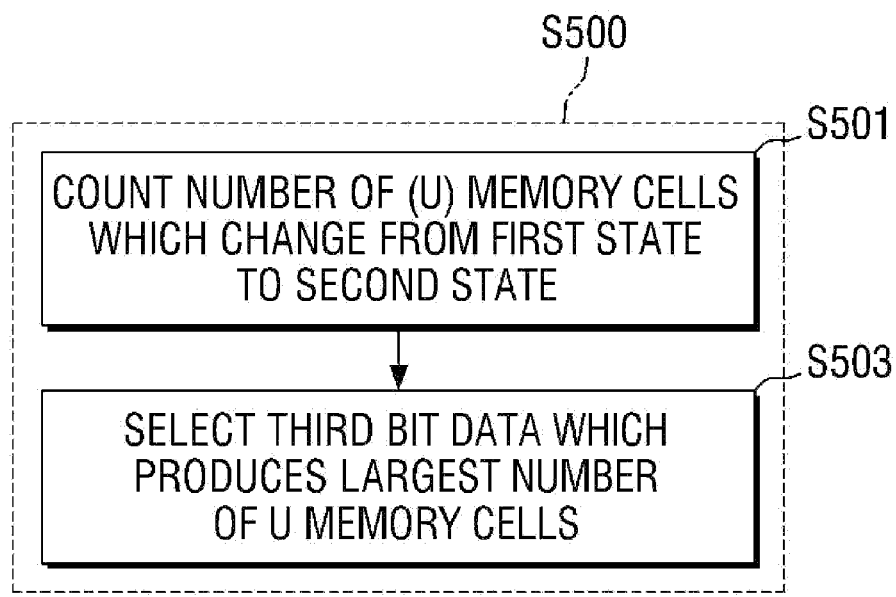
FIG. 4 is a flowchart illustrating operation S500 of FIG. 1 in detail, according to an embodiment of the inventive concept.

FIG. 4 is a flowchart illustrating operation S500 of FIG. 1 in detail, according to an embodiment of the inventive concept. Referring to FIG. 4, the number of target memory cells (S memory cells) that change from the first state to the second state when the plurality of memory cells are programmed with third bit data is counted (operation S501). Hereinafter, the S memory cells having states that change from the first state to the second state when programmed with third bit data will be referred to as U memory cells.

After the plurality of third bit data are generated, the number of U memory cells for each of the generated third bit data is counted, and the third bit data of the plurality of third bit data that produces the largest number of U memory cells is selected (operation S503).

As mentioned above, the selected third bit data is programmed into the memory cells (operation S600). In other words, the memory cells are programmed with the selected third bit data, as opposed to the second bit data. When the selected third bit data is programmed into the memory cells, an address of the mask used to calculate the selected third bit data may also be programmed into the memory cells.

Figure 5:
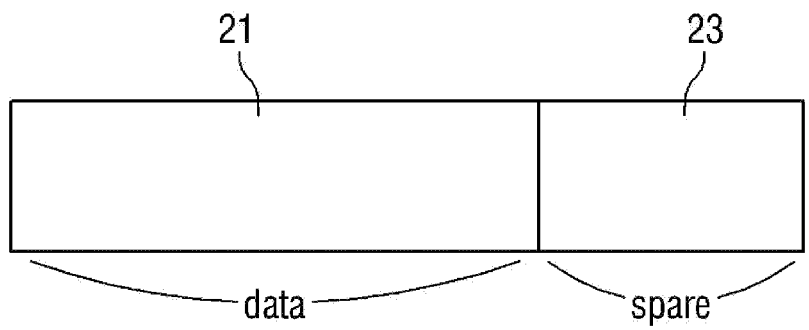
FIG. 5 is a diagram illustrating one page.

FIG. 5 is a diagram illustrating one page of memory. Specifically, referring to FIG. 5, representative memory cell 20 of a plurality of memory cells included a data area 21 for storing actual data and a spare area 23 for storing metadata, option information, flag information, etc. As applied to the present embodiment, the selected third bit data is programmed into the data area 21, and the address of the mask used to calculate the selected third bit data is programmed into the spare area 23.

The address of the mask used to calculate the selected third bit data that produces the largest number of U memory cells is programmed into the memory cells so that the mask can be subsequently identified from among a plurality of predetermined masks. The second data can then be easily reconstructed during a data read operation, e.g., using the same mask retrieved from the memory cells.

Meanwhile, if no U memory cells (U=0) result from comparing the S memory cells of second bit data with the S memory cells of the first bit data, the second bit data may be programmed into the memory cells without having to first calculate the plurality of third bit data.

Figure 6:
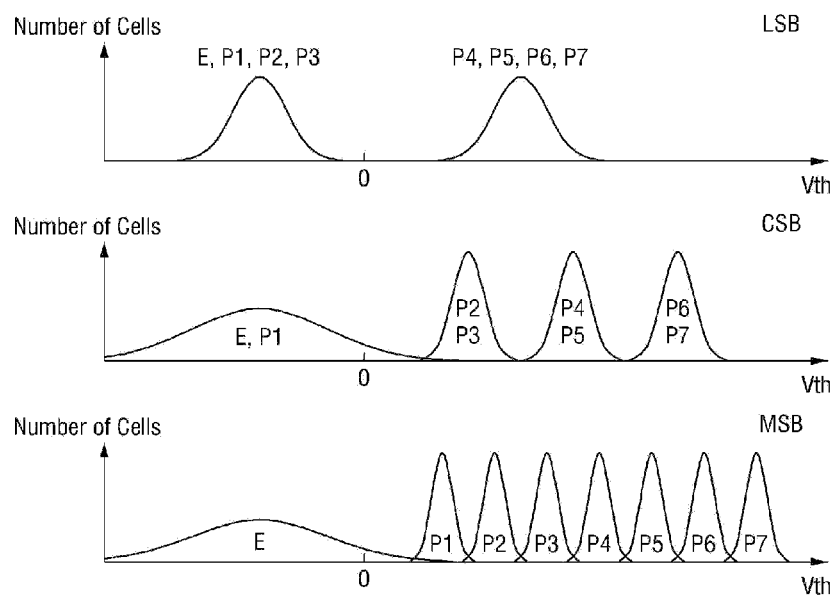
FIG. 6 is a graph illustrating threshold voltage distributions for each page.
Figure 7:
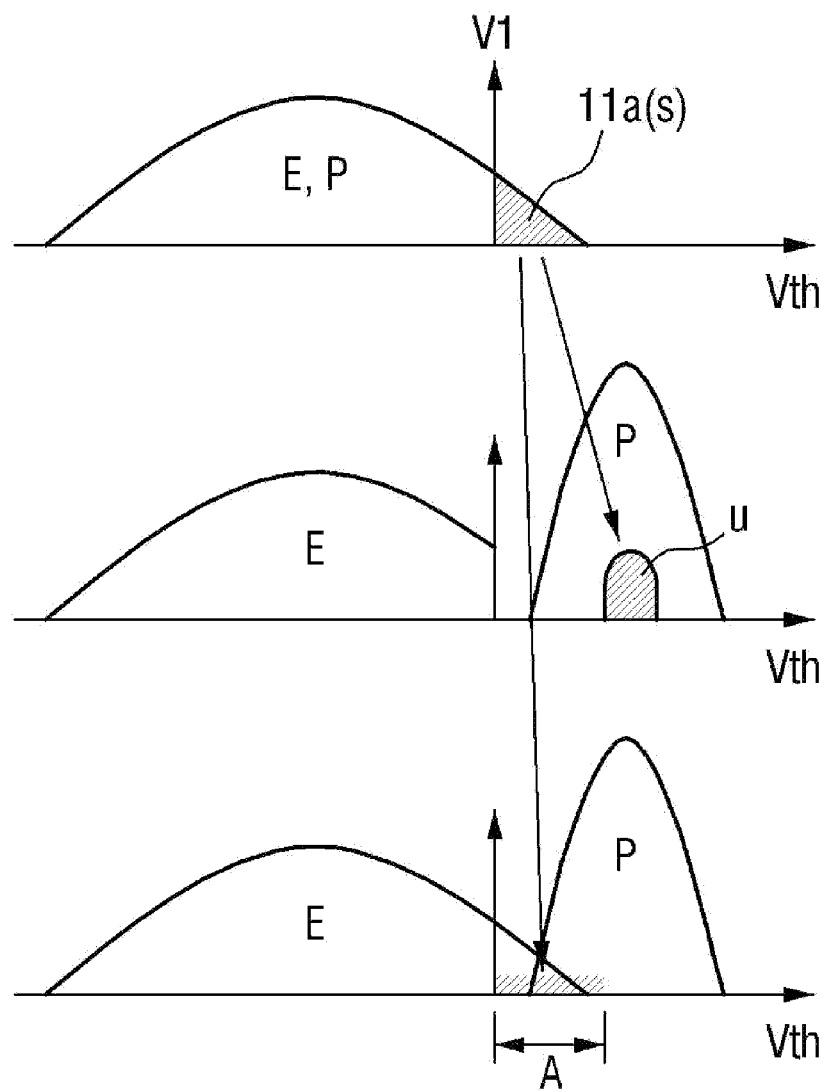
FIG. 7 is a diagram for explaining the reason an error occurs when a memory cell is programmed.

FIGS. 6 and 7 are diagrams illustrating effects brought about by programming memory cells with the third bit data, according to an embodiment of the inventive concept. More specifically, FIG. 6 is a graph illustrating threshold voltage distribution for each page, and FIG. 7 is a diagram for explaining why error occurs when a memory cell is programmed.

Referring to FIG. 6, generally, a plurality of data can be programmed (E, P1 through P7) into one MLC. Increased integration density reduces the gap between adjacent cells, which, in turn, causes memory cells programmed to an erase state or a program state to interfere with each other. As shown in FIG. 6, in the case of the LSB data, the gap between threshold voltage distributions is relatively wide. However, the gaps between the threshold voltage distributions become narrower for the CSB data and the MSB data, and thus the threshold voltage distributions may overlap each other. Particularly, in the case of the MSB data, the threshold voltage distribution of the erase state E is wide, and the gaps between adjacent threshold voltage distributions of program states P1 through P7 are narrow. In addition, since the threshold voltage distribution of the erase state E is wide, the probability that a threshold voltage distribution of a memory cell will overlap those of adjacent cells increases in the erase state E. Also, there is a high probability of coupling, disturbance or the like.

Threshold voltage distributions of memory cells may change due to repeated use of the memory cells. For example, the memory cells may be degraded as they are repeatedly used, and the threshold voltage distributions of the degraded memory cells may become wider and/or may shift to the left or right. Consequently, the threshold voltage distributions of the memory cells become more likely to overlap each other.

In FIG. 6, multi-level cells are described. However, like the multi-level cells, single-level cells (SLC) may also degrade as a result of repeated use. When single-level cells are degraded, their threshold voltage distributions may become wider and/or may shift to the left or right. Therefore, threshold voltage distributions of the erase state and the program state may overlap each other.

A phenomenon by which an error occurs when a memory cell is programmed will now be described with reference to FIG. 7. In FIG. 7, a shift from an ease state to a program state is illustrated for ease of description. However, the inventive concept is not limited thereto. The same phenomenon may occur in the case of a shift from a program state to another program state.

A threshold voltage of a memory cell belonging to an upper part of an erase state distribution is likely to move toward a program state distribution due to coupling and/or disturbance with adjacent cells. For example, it may be assumed that the threshold voltage of the memory cell is located in a first partial distribution 11a of threshold voltages equal to or greater than a first voltage V1. In this case, if the state of the memory cell changes from an erase state E to a program state P when next bit data is programmed into the memory cell, the memory cell can be programmed to the program state P without any problem. However, if the memory cell maintains the erase state E when programmed with the next bit data, the memory cell may be programmed to a distribution part between the erase state E and the program state P or to a distribution part A in which the erase state E and the program state P overlap each other. Therefore, an error occurs when the memory cell is programmed. That is, the memory cell may be programmed to the program state P even though it is intended to be programmed to the erase state E, and may be erroneously perceived as being in the program state P during a data read operation.

Such errors may occur more frequently when the memory cell is degraded or when the threshold voltage distribution becomes wider and/or shifts to the left or right. In other words, more errors are likely to occur during program operations when the erase state E has a wide threshold voltage distribution or when the MSB data has narrow gaps between adjacent threshold voltage distributions. Therefore, when the selected third bit data, which changes the largest number of target memory cells to the second state, is programmed according to the inventive concept, the number of memory cells being programmed to undesired states can be reduced.

Figure 8:
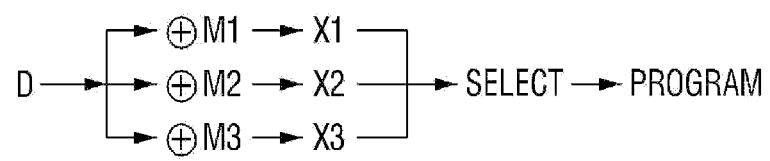
FIG. 8 is a flowchart illustrating a method of programming second bit data into a plurality of memory cells, according to an embodiment of the inventive concept.

An example will be described with reference to FIG. 8, which is a flowchart illustrating a method of programming second bit data into a plurality of memory cells, according to an embodiment of the inventive concept.

Illustrative first bit data and second bit data are as shown in Table 1 below, in which MC1 through MC8 represent memory cells. For purposes of explanation, it may be assumed that the first state is an erase state, and that there are three S memory cells (S=3), memory cells MC4, MC6 and MC8, indicated by shading. The erase state is represented by "1" and a program state is represented by "0."

TABLE 1

| | Memory Cell | | | | | | | | |
|---|---|---|---|---|---|---|---|---|---|
| | MC1 | MC2 | MC3 | MC4 | MC5 | MC6 | MC7 | MC8 | |
| First bit data | 1 | 0 | 0 | 1 | 1 | 1 | 0 | 1 | S = 3 |
| Second bit data (D) | 1 | 1 | 0 | 0 | 0 | 1 | 1 | 1 | |

Since S=3 (as opposed to S=0) in the first bit data, the second bit data is not programmed immediately. Instead, the number of U memory cells is counted by comparing the states of the S memory cells of the second bit data with the states of the S memory cells of the first bit data. Based on this comparison, it is determined in this example that one memory cell (MC4) has a state that changes from "1" to "0," and thus U=1. Since the states of all of the S memory cells have not changed, a first operation is performed on the second bit data with predetermined masks M1 through M3 in order to generate corresponding third bit data X1 through X3, respectively. Illustrative masks M1 through M3 are as shown in Table 2.

TABLE 2

| | Memory cell | | | | | | | |
|---|---|---|---|---|---|---|---|---|
| Mask | MC1 | MC2 | MC3 | MC4 | MC5 | MC6 | MC7 | MC8 |
| M1 | 1 | 0 | 1 | 0 | 0 | 0 | 1 | 0 |
| M2 | 1 | 1 | 0 | 0 | 1 | 1 | 0 | 1 |
| M3 | 0 | 0 | 1 | 1 | 0 | 1 | 0 | 1 |

The first operation is performed on each of the masks M1 through M3 and the second bit data. The first operation may be an exclusive or (XOR) operation, for example, as mentioned above. The first operation produces multiple third bit data X1 through X3 corresponding to the masks M1 through M3, as shown in Table 3.

TABLE 3

| Third bit data | Memory cell | | | | | | | | |
| --- | --- | --- | --- | --- | --- | --- | --- | --- | --- |
|  | MC1 | MC2 | MC3 | MC4 | MC5 | MC6 | MC7 | MC8 | |
| D xor M1 = X1 | 0 | 1 | 1 | 0 | 0 | 1 | 0 | 1 | U = 1 |
| D xor M2 = X2 | 0 | 0 | 0 | 0 | 0 | 0 | 1 | 0 | U = 3 |
| D xor M3 = X3 | 1 | 1 | 1 | 1 | 0 | 0 | 1 | 0 | U = 2 |
| First bit data | 1 | 0 | 0 | 1 | 1 | 1 | 0 | 1 | |

Each of the third bit data X1 through X3 is compared to the first bit data, respectively, to determine which of the third bit data X1 through X3 provides the largest number of S memory cells that change from the first state to the second state (that is, the largest number of U memory cells). Based on the comparison, it is determined that the third bit data X2 provides the most U memory cells (U=3). The third bit data X2 is therefore selected, and programmed into the memory cells MC1 through MC8 after the first bit data. When the selected third bit data X2 is programmed into the memory cells MC1 through MC8, an address of the selected third bit data X2 and/or the corresponding mask M2 used to generate the third bit data X2 is also programmed.

Figure 9:
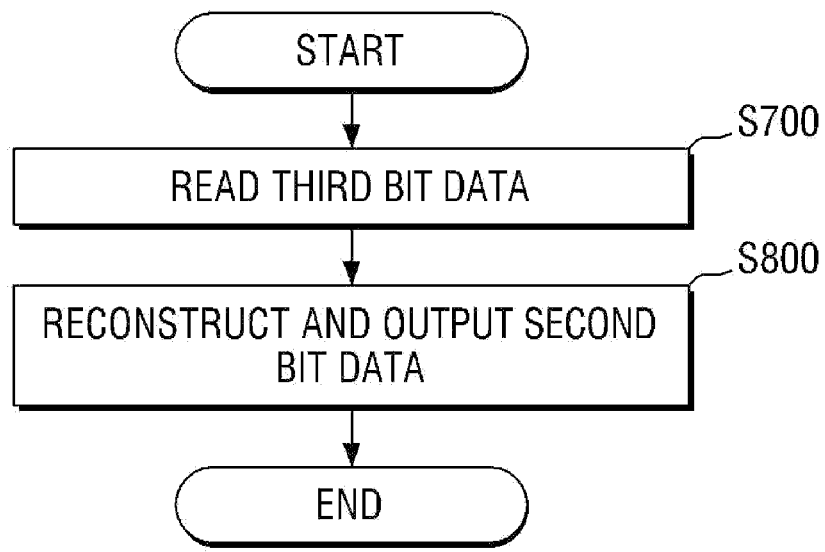
FIG. 9 is a flowchart illustrating a method of reconstructing data, according to an embodiment of the inventive concept.

A data reconstruction process for reconstructing second bit data using the third bit data will now be described with reference to FIG. 9. FIG. 9 is a flowchart illustrating a method of reconstructing data, according to an embodiment of the inventive concept.

After the memory cells MC1 through MC8 have been programmed with the selected third bit data, the programmed third bit data is read (operation S700). Then, second bit data is then reconstructed by performing a second process on the read third bit data, and the reconstructed second bit data is output (operation S800). The second bit data is original data that should have been programmed into the memory cells following the first bit data.

In an embodiment, the first process calculates the selected third bit data based on the received second bit data, and the second process reconstructs the second bit data from the selected third bit data programmed into the memory cells. For example, the second process may reconstruct the second bit data by performing a second operation on the selected third bit data and the mask used to calculate the selected third bit data. The second operation can be any operation capable of reconstructing the second bit data. As mentioned above, when the selected third bit data is programmed into the memory cells, an address of the mask used to calculate the selected third bit data may also be programmed. Therefore, the mask used to calculate the selected third bit data can be retrieved using the programmed address of the mask.

In the present example, each of the first operation and the second operation may be an XOR operation. When the plurality of third bit data are calculated using the XOR operation as the first operation, the XOR operation may also be used as the second operation to reconstruct the second bit data from the selected third bit data.

Error correcting code (ECC) encoding may be performed on the selected third bit data before the selected third bit data is programmed into the memory cells, and ECC decoding may be performed on the programmed third bit data before the programmed third bit data is read. The ECC encoding and ECC decoding may prevent the occurrence of errors during data transmission, thereby ensuring data reliability and accuracy.

The effect of the number of masks on reducing programming errors will be described with reference to FIG. 10, which is a graph illustrating the reduction in programming errors with respect to the number of masks, according to an embodiment of the inventive concept.

Figure 10:
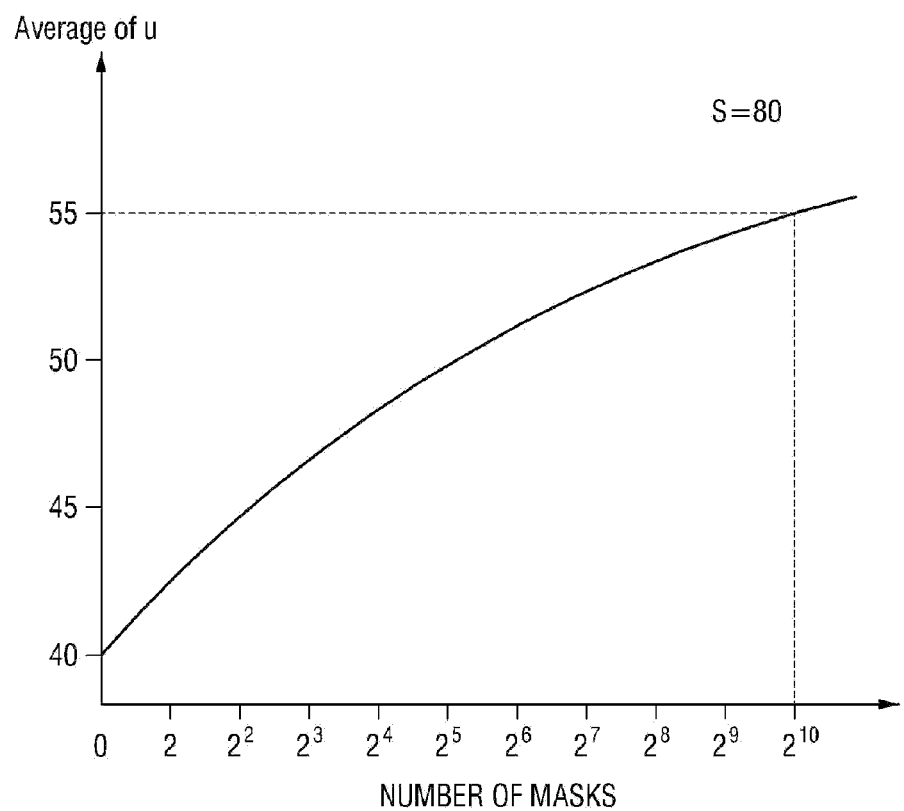
FIG. 10 is a graph illustrating programming errors with respect to the number of masks, according to an embodiment of the inventive concept.

In particular, FIG. 10 is a graph illustrating the variation in the average number of U memory cells with respect to the number of masks when the original data has $2^{13}$ (8192) bits and the number of S memory cells is 80 (S=80), for example. The x axis represents the number of masks, and the y axis represents the average number of memory cells U. When no mask exists, the average number of U memory cells is 40 (50 percent of S memory cells). As shown in FIG. 10, an increase in the number of masks leads to an increase in the number of U memory cells. When the number of masks is $2^{10}$, the number of U memory cells increases, on average, to 55 (68.75 percent of the S memory cells).

A method of operating a memory device according to another embodiment of the inventive concept will now be described with reference to FIGS. 11 and 12. For simplicity, descriptions of elements and features the same as those of the previous embodiment will not be repeated, and the following description will focus on differences from the previous embodiment.

Figure 11:
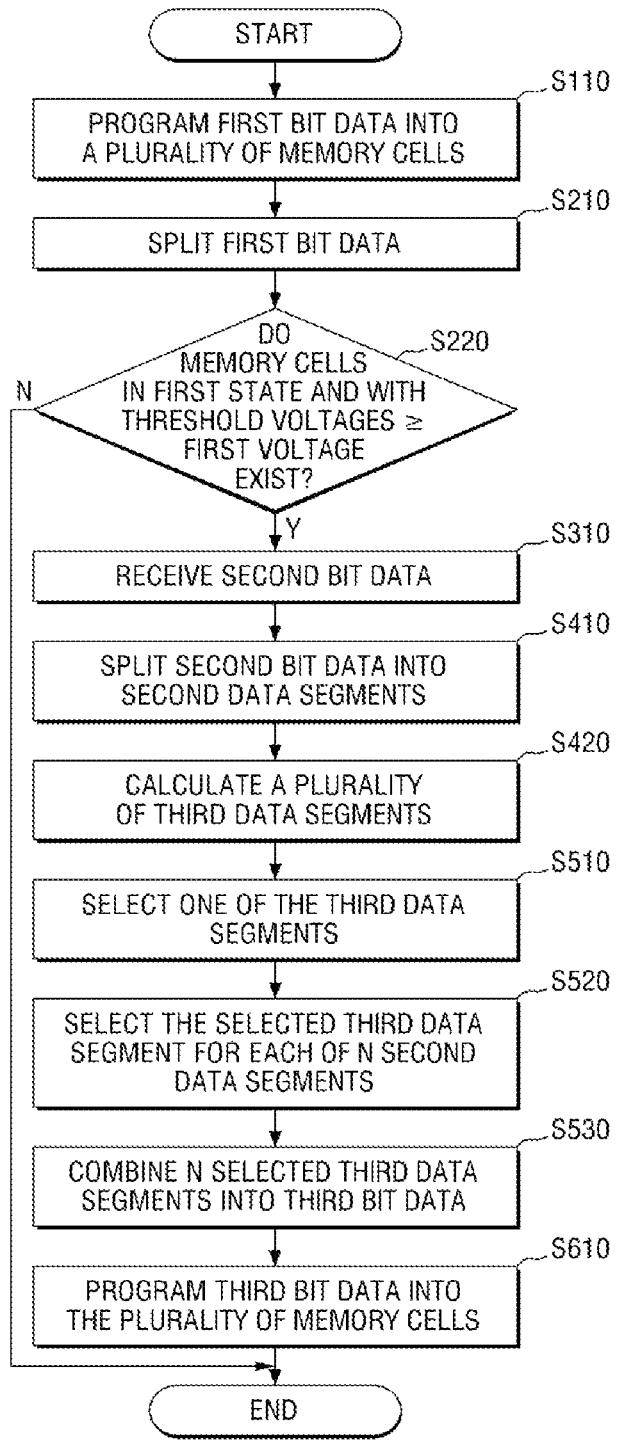
FIG. 11 is a flowchart illustrating a method of operating a memory system, according to another embodiment of the inventive concept.
Figure 12:
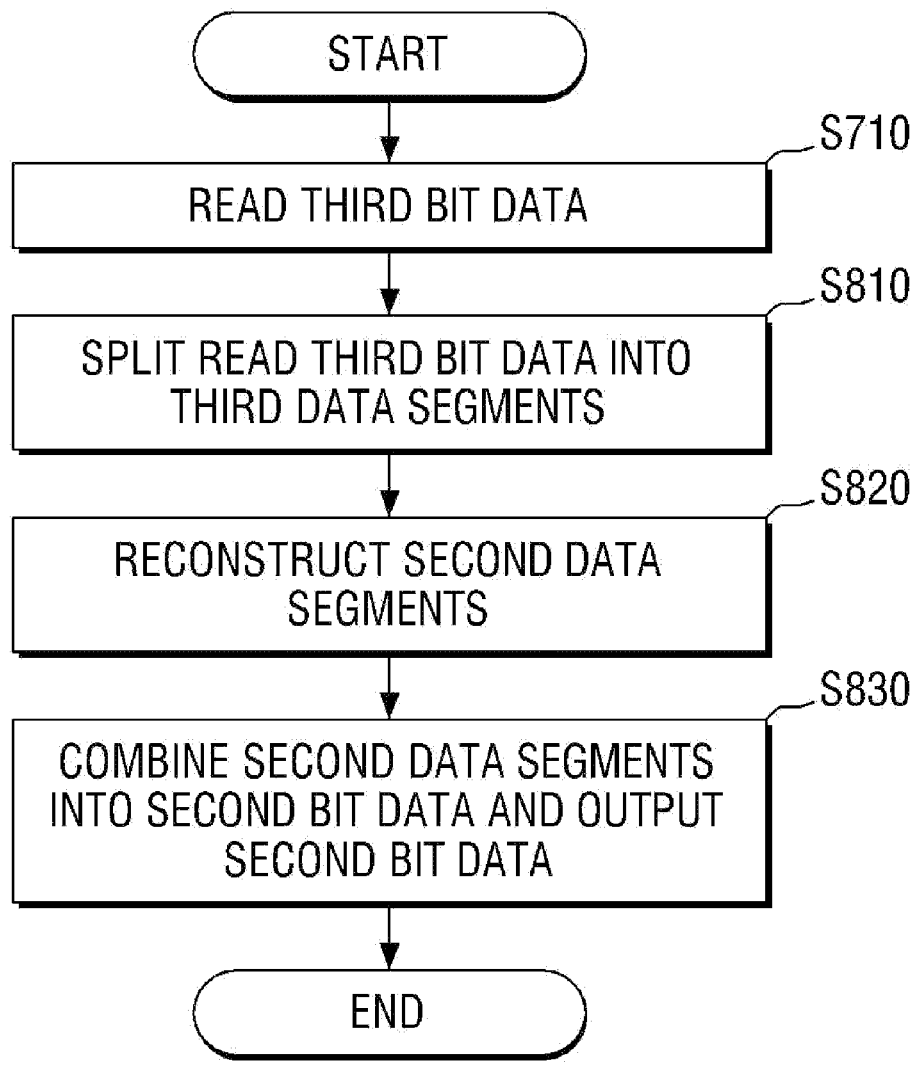
FIG. 12 is a flowchart illustrating a method of reconstructing data, according to another embodiment of the inventive concept.

FIG. 11 is a flowchart illustrating a method of operating a memory device, according to another embodiment of the inventive concept. FIG. 12 is a flowchart illustrating a data reconstruction process, according to another embodiment of the inventive concept.

First, first bit data is programmed into a plurality of memory cells (operation S110), and the first bit data is split into n (where n is a natural number) first data segments (operation S210). Target memory cells (S memory cells) are then identified from the memory cells programmed with each of the first data segments. That is, it is determined whether memory cells exist that are in a first state and have threshold voltages equal to or greater than a first voltage (operation S220). As compared to the previous embodiment, S memory cells are identified with respect to the first data segments, not the first bit data. If no S memory cells are identified from the memory cells programmed with the first data segments, second data segments can be programmed into the memory cells. However, if the S memory cells are identified, the following process is performed for each of the respective first data segments.

Second bit data is received (operation S310) and then split into a plurality of second data segments (operation S410). The second data segments are n data segments into which the second bit data is split. A plurality of third data segments are calculated by performing a third process on the second data segments (operation S420). In the third process, a first operation is performed on the second data segments with a plurality of masks. Unlike the previous embodiment, the masks have the same number of bits as the second data segments, not the second bit data.

From the third data segments calculated through the third process, a third data segment that changes a largest number of target memory cells within each of the first data segments from the first state to a second state, when the memory cells are programmed with each of the third data segments, is selected (operation S510). That is, the third data segment which produces the largest number of U memory cells is selected from among the calculated third data segments.

The third data segment which produces the largest number of U memory cells is selected for each of the n second data segments (operation S520). Since the number of the second data segments is n, n selected third data segments may be selected. The n selected third data segments are combined into third bit data (operation 530). The third bit data has the same size as the second bit data. Finally, the third bit data is programmed into the memory cells (operation S610).

Unlike the previous embodiment, in the current embodiment, each of the first bit data and the second bit data is split into n data segments in order to decrease the size of the masks and increase the total number of U memory cells. Generally, as the first bit data and the second bit data become larger, the masks also become larger. In addition, to increase the number of U memory cells, the number of masks should be increased. However, if the size and number of masks increase, the portion of the memory occupied by the masks increases. Therefore, to increase the number of U memory cells while reducing the size of the masks and the portion of the memory occupied by the masks, each of the first bit data and the second bit data is split into n first and second data segments, respectively, and masks having the same size as the first data segments and the second data segments are used.

As in the previous embodiment, the second bit data may be MSB data, the first state may be an erase state, and the first operation may be an XOR operation, for example. In addition, when the third bit data is programmed into the memory cells, addresses of n masks used to calculate the n selected third data segments may also be programmed.

A data reconstruction process according to another embodiment of the inventive concept will now be described with reference to FIG. 12.

After a plurality of memory cells have been programmed with third bit data, into which n selected third data segments were combined, the third bit data is read (operation S710). Then, the read third bit data is split into the n third data segments (operation S810). After the third bit data is split into the n third data segments, second data segments are reconstructed by performing a fourth process on each of the n third data segments (operation S820). The fourth process is a process for reconstructing the second data segments from the third data segments. In the fourth process, the second data segments may be reconstructed by performing a second operation on the selected third data segments with the masks used to calculate the selected third data segments, respectively. When the third bit data is programmed into the memory cells, addresses of n masks used to calculate the n selected third data segments may also be programmed. Therefore, the n masks used to calculate the n selected third data segments can be retrieved using the programmed addresses of the n masks. Here, the second operation may be the XOR operation, for example.

The n second data segments are combined into the second bit data, and then the second bit data is output (operation S830). The second bit data is original data that should have been programmed into the memory cells following the first bit data.

To ensure data reliability, ECC encoding may be performed on the third bit data before the third bit data is programmed. Also, ECC decoding may be performed on the third bit data before the third bit data is read.

A memory system according to an embodiment of the inventive concept will now be described with reference to FIGS. 13 and 14. Again, any repetitive description of elements and features described above will not be repeated.

Figure 13:
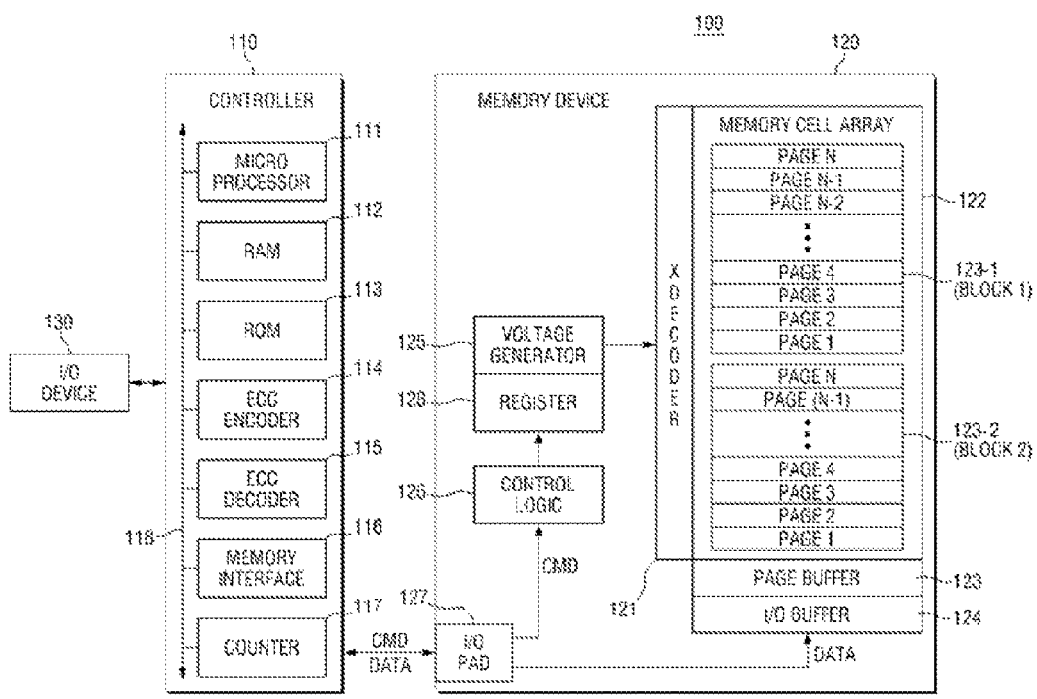
FIG. 13 is a block diagram of a memory system, according to an embodiment of the inventive concept.

FIG. 13 is a block diagram of a memory system 100, according to an embodiment of the inventive concept. FIG. 14 is a diagram illustrating one page of a memory cell array 122 shown in FIG. 13, according to an embodiment of the inventive concept.

Referring to FIG. 13, the memory system 100 includes a controller 110, a nonvolatile memory device 120, and an input/output device 130. The nonvolatile memory device 120 may be, but is not limited to, a NAND flash memory device or a NOR flash memory device, for example. The nonvolatile memory device 120 may include a planar memory cell structure and a 3D stacked memory cell structure, for example.

The nonvolatile memory device 120 includes a memory cell array 122, an X decoder (row selection circuit) 121, a voltage generator 125, an I/O pad 127, an I/O buffer 124, a page buffer 123, and control logic 126.

The memory cell array 122 includes a plurality of memory cells, a plurality of word lines W/L, and a plurality of bit lines B/L. Each of the memory cells may store 1-bit data or M-bit (multi-bit) data, where M is a natural number equal to or greater than two. The memory cell array 122 may include a plurality of blocks and a plurality of pages, where one block includes multiple pages. Program and read operations may be performed in page units, and erase operations may be performed in block units. For example, in a read operation, data programmed into one page is read.

The memory cell array 122 may be implemented as a single-layer array structure (also called a 2D array structure) or a multi-layer array structure (also called a 3D array structure).

First bit data and second bit data, or the first bit data and third bit data, can be programmed into the plurality of memory cells of the memory cell array 122. Additionally, the address of a mask used to calculate the third bit data may be stored in the memory cells.

Figure 14:
FIG. 14 is a diagram illustrating one page of a memory cell array shown in FIG. 13, according to an embodiment of the inventive concept.

Referring to FIG. 14, one page 60 in the memory cell array 122 includes a data area 61-1 and a spare area 60-2. The data area 60-1 may store data provided by a host, and the spare area 60-2 may store metadata related to the data of the data area 60-1, timestamp data, and the like. The first bit data, the second bit data and the third bit data may be stored in the data area 60-1, and the address of the mask used to calculate the third bit data may be stored in the spare area 60-2, for example.

Referring back to FIG. 13, the control logic 126 controls overall operation of the nonvolatile memory device 120. When receiving a command CMD from the controller 110, the control logic 126 interprets the command CMD and controls the nonvolatile memory device 120 to perform an operation (such as a program operation, a read operation, a read retry operation, or an erase operation) corresponding to the interpreted command. In addition, the control logic 126 may identify target memory cells which are in a first state and have threshold voltages equal to or greater than a first voltage from the memory cells. Therefore, the control logic 126 may store information about the positions and number of the identified target memory cells.

The X decoder 121 is controlled by the control logic 126 and drives at least one of the word lines W/L implemented in the memory cell array 122 according to a row address. The voltage generator 125 is controlled by the control logic 126 to generate one or more voltages required for a program operation, an operation of identifying target memory cells or an erase operation, and provides at least one voltage selected by the X decoder 121.

A register 128 is a space in which information input from the controller 110 is stored. The register 128 may include a plurality of latches. For example, the register 128 may group read voltage information and store the information in the form of a table.

The page buffer 123 is controlled by the control logic 126 and operates as a sense amplifier or a write driver according to an operation mode (e.g., a read operation or a program operation). The I/O pad 127 and the I/O buffer 124 may serve as a data I/O path between an external device (e.g., the controller 110) and the nonvolatile memory device 120.

The controller 110 includes a microprocessor 111, a read-only memory (ROM) 113, a random access memory (RAM) 112, an ECC encoder 114, an ECC decoder 115, a memory interface 116, a counter 117, and a bus 118. The microprocessor 111, the ROM 113, the RAM 112, the ECC encoder 114, the ECC decoder 115, the memory interface 116, and the counter 117 of the controller 110 may be electrically connected to each other through the bus 118.

The microprocessor 111 controls the overall operation of the memory system 100, including the controller 110. When power is supplied to the memory system 100, the microprocessor 111 drives firmware (stored in the ROM 113) for operating the memory system 100 on the RAM 112, thereby controlling the overall operation of the memory system 100.

In FIG. 13, driver firmware code of the memory system 100 may be stored in the ROM 113. However, the scope of the inventive concept is not limited thereto. The firmware code may also be stored in various nonvolatile memory devices 120 other than the ROM 113. Therefore, the control or intervention of the microprocessor 111 may encompass not only direct control of the microprocessor 111, but also intervention of firmware which is software driven by the microprocessor 111.

Predetermined masks may be stored in the ROM 113. The microprocessor 111 may calculate the plurality of third bit data by performing a first operation on the second bit data with the masks stored in the ROM 113. All of the predetermined masks may be stored in the ROM 113. However, masks having different bit patterns only may also be stored. For example, there may be masks M11 through M17 each having three memory cells MC1 through MC3 as shown in Table 4, for example. In this case, to calculate the plurality of third bit data, the first operation may be performed on the second bit data with each of the masks through shown in Table 4.

TABLE 4

|     | MC1 | MC2 | MC3 |
|-----|-----|-----|-----|
| M11 | 0   | 0   | 1   |
| M12 | 0   | 1   | 0   |
| M13 | 1   | 0   | 0   |
| M14 | 0   | 1   | 1   |
| M15 | 1   | 0   | 1   |
| M16 | 1   | 1   | 0   |
| M17 | 1   | 1   | 1   |

Here, all of the masks M11 through M17 shown in Table 4 can be stored in the ROM 113. In this case, however, a portion of the ROM 113 occupied by masks may increase. Therefore, the masks through having one erase state ("1") may be grouped together as a first bit pattern, masks through having two erase states may be grouped together as a second bit pattern, and mask having three erase states may be grouped as a third bit pattern. Here, only one mask from each bit pattern may be stored in the ROM 113. For example, the mask of the first bit pattern, the mask of the second bit pattern, and the mask of the third bit pattern may be selected, and only the three selected masks, and may be stored in the ROM 113. If the mask is stored in the ROM 113, the entire first bit pattern can be generated through bit shifting. If the mask is stored in the ROM 113, the entire second bit pattern can be generated through bit shifting. Consequently, a portion of the ROM 113 occupied by masks can be reduced, while obtaining the same effect as when all of a plurality of masks are stored in the ROM 113.

The RAM 112, which is a memory serving as a buffer, may store an initial command, data, and various variables input from the host or data output from the nonvolatile memory device 120. The RAM 112 may store data and various parameters and variables input to and output from the nonvolatile memory device 120. For example, the RAM 112 may store first bit data, second bit data, a first operation, a second operation, and multiple sets of third bit data calculated by performing the first operation on the second bit data with a plurality of masks.

The memory interface 116 interfaces between the controller 110 and the nonvolatile memory device 120. The memory interface 116 is connected to the I/O pad 127 of the nonvolatile memory device 120 and may exchange data with the I/O pad 127. In addition, the memory interface 116 may create a command appropriate for the nonvolatile memory device 120 and provide the created command appropriate for the nonvolatile memory device 120 to the I/O pad 127. The memory interface 116 provides a command to be executed by the nonvolatile memory device 120 and an address ADD (e.g., an address of a mask and an address of the third bit data) of the nonvolatile memory device 120.

The ECC encoder 114 and the ECC decoder 115 perform error bit correction. The ECC encoder 114 generates data added with parity bits by performing error correction encoding on data provided to the nonvolatile memory device 120. The parity bits may be stored in the nonvolatile memory device 120.

The ECC decoder 115 performs error correction decoding on output data, determines whether the error correction decoding is successful based on the result of the error correction decoding, and outputs an instruction signal based on the determination result. Read data may be transmitted to the ECC decoder 115, and the ECC decoder 115 may correct error bits of the data using parity bits. When the number of error bits exceeds a maximum number of error bits that can be corrected, the ECC decoder 115 cannot correct the error bits, resulting in an error correction failure. The ECC encoder 114 and the ECC decoder 115 may perform error correction using, for example, low density parity check (LDPC) code, BCH code, turbo code, Reed-Solomon code, convolution code, recursive systematic code (RSC), or coded modulation such as trellis-coded modulation (TCM) or block coded modulation (BCM).

For example, after third bit data which produces a largest number of changed memory cells is selected, ECC encoding may be performed on the selected third bit data using the ECC encoder 114 before the selected third bit data is programmed into the nonvolatile memory device 120. In addition, ECC decoding may be performed on the third bit data stored in the nonvolatile memory device 120 before the third bit data is read.

Each of the ECC encoder 114 and the ECC decoder 15 may include an error correction circuit, system or device.

The counter 117 stores positions of S memory cells and counts the number of S memory cells and the number of U memory cells according to some embodiments of the inventive concept. In addition, the counter 117 stores information about the counted number of S memory cells and the counted number of U memory cells and provides this information to the microprocessor 111.

The memory interface 116 provides a read command and an address to the nonvolatile memory device 120. The nonvolatile memory device 120 reads data stored in pages of a first block 123-1 corresponding to the received address. The read data is provided to the ECC decoder 115 via the I/O pad 127. The ECC decoder 115 checks error bits of the data provided by the nonvolatile memory device 120 and corrects the error bits.

Referring again to FIG. 13, the microprocessor 111 may perform various operations. For example, the microprocessor 111 may receive information about the number of S memory cells identified by the control logic 126 and determine whether to modulate the second bit data. In addition, the microprocessor 111 may calculate the third bit data by performing the first operation on the second bit data with the masks. The microprocessor 111 may select third bit data which produces the largest number of changed memory cells by referring to the counting result of the counter 117 and program the selected third bit data to the nonvolatile memory device 120, specifically, the memory cell array 122.

To read programmed data, the microprocessor 111 may perform the second operation on third bit data programmed into memory cells with the mask used to calculate the third bit data. As a result, the second bit data may be reconstructed from the third bit data.

The I/O device 130 may be connected between the host (not shown) and the controller 110 and may input/output data to/from the memory system 100. For example, the I/O device 130 may deliver the first bit data and the second bit data to the memory system 100, and receive from the memory system 100 the second bit data reconstructed using the third bit data and output the reconstructed second bit data.

The first through third bit data, the first and second operations, and the first and second states are as described above.

While the inventive concept has been described with reference to illustrative embodiments, it will be apparent to those of ordinary skill in the art that various changes and modifications may be made without departing from the spirit and scope of the inventive concept. Therefore, it should be understood that the above embodiments are not limiting, but illustrative.

What is claimed is:

1. A method of operating a memory system, the method comprising:
   programming first bit data into a plurality of memory cells;
   identifying target memory cells that are in a first state and have threshold voltages equal to or greater than a first voltage from the plurality of memory cells programmed with the first bit data;
   receiving second bit data which is to be programmed into the plurality of memory cells;
   calculating a plurality of third bit data by performing a first process on the second bit data;
   selecting third bit data of the calculated plurality of third bit data that changes a largest number of target memory cells from the first state to a second state when the memory cells are programmed with each of the plurality of third bit data, respectively; and
   programming the selected third bit data into the memory cells.

2. The method of claim 1, wherein the second bit data is most significant bit (MSB) data.

3. The method of claim 1, wherein the first state is an erase state.

4. The method of claim 1, wherein calculating of the plurality of third bit data by performing the first process on the second bit data comprises performing a first operation on the second bit data with a plurality of predetermined masks.

5. The method of claim 4, further comprising:
   programming an address of a mask used to calculate the selected third bit data into the memory cells.

6. The method of claim 5, wherein each of the memory cells comprises a data area and a spare area, and
   wherein programming the selected third bit data into the memory cells comprises programming the selected third bit data into the data area, and programming the address of the mask used to calculate the selected third bit data into the memory cells comprises programming the address of the mask used to calculate the selected third bit data into the spare area.

7. The method of claim 4, further comprising:
   reading the selected third bit data after programming the selected third bit data into the memory cells;
   reconstructing the second bit data by performing a second process on the read third bit data; and
   outputting the reconstructed second bit data.

8. The method of claim 7, wherein performing the second process comprises performing a second operation on the read third bit data with the mask used to calculate the selected third bit data.

9. The method of claim 8, wherein the first operation and the second operation are XOR operations.

10. The method of claim 7, further comprising:
    performing error correcting code (ECC) encoding on the selected third bit data before the selected third bit data is programmed into the memory cells; and
    performing ECC decoding on the programmed third bit data before reading the selected third bit data.

11. The method of claim 1, wherein identifying of the target memory cells comprises splitting the first bit data into n first data segments and identifying target memory cells which are in the first state and have threshold voltages equal to or greater than the first voltage from the memory cells programmed with the first data segments,
    wherein calculating of the plurality of third bit data comprises splitting the second bit data into n second data segments and calculating a plurality of third data segments by performing a third process on the second data segments, and
    wherein selecting the third bit data comprises selecting a third data segment which changes the largest number of target memory cells from the first state to the second state when the memory cells are programmed with each of the third data segments from the third data segments, selecting the selected third data segment for each of the n second data segments, and combining the n selected third data segments into third bit data, wherein n is a natural number.

12. A memory system, comprising:
    a nonvolatile memory device comprising a plurality of memory cells;
    an input/output (I/O) device configured to receive first bit data and second bit data which are to be programmed into the memory cells; and
    a controller configured to control the nonvolatile memory device, wherein the nonvolatile memory device comprises control logic configured to identify target memory cells from the memory cells programmed with the first bit data, the target memory cells being in a first state and having threshold voltages equal to or greater than a first voltage, and wherein the controller comprises:
- a read-only memory (ROM) configured to store a plurality of masks;
- a microprocessor configured to calculate a plurality of third bit data by performing a first operation on the second bit data with the plurality of masks, respectively;
- a random-access memory (RAM) configured to store the plurality of third bit data calculated by the microprocessor; and
- a counter configured to count a number of target memory cells which change from the first state to a second state when the memory cells are programmed with each of the plurality of third bit data, and to provide counting results to the microprocessor, the microprocessor being further configured to select third bit data of the plurality of third bit data which produces a largest counting result, and to program the selected third bit data into the nonvolatile memory device.

13. The memory system of claim 12, wherein the nonvolatile memory device is configured to store an address of a mask used to calculate the selected third bit data.

14. The memory system of claim 13, wherein the microprocessor is further configured to reconstruct the second bit data by performing a second operation on the programmed third bit data with the mask used to calculate the selected third bit data, and wherein the I/O device is further configured to output the reconstructed second bit data.

15. The memory system of claim 12, wherein the masks stored in the ROM have different bit patterns.

16. A method of operating a memory system, the method comprising:
- programming first bit data into a plurality of memory cells;
- splitting the first bit data into a plurality of first data segments;
- identifying target memory cells that are in a first state and have threshold voltages equal to or greater than a first voltage from the plurality of memory cells programmed with the first data segments;
- receiving second bit data which is to be programmed into the plurality of memory cells;
- splitting the second bit data into a plurality of second data segments;
- calculating a plurality of third data segments for each of the plurality of second data segments by performing a first process on the corresponding second data segment;
- selecting a third data segment of the plurality of third data segments that changes a largest number of target memory cells from the first state to a second state within each of the plurality of second data segments, respectively, to provide a plurality of selected third data segments;
- combining the plurality of selected third data segments into third bit data; and
- programming the third bit data into the plurality of memory cells.

17. The method of claim 16, further comprising:
- reading the programmed third bit data from the plurality of memory cells;
- splitting the read third bit data into the plurality of third data segments; and
- reconstructing the plurality of second data segments by performing a second process on the plurality of third data segments, respectively.

18. The method of claim 17, wherein performing the first process comprises performing a first operation on the second data segment with a plurality of masks corresponding to the plurality of third data segments, and wherein performing the second process comprises performing a second operation on the plurality of third data segments with the plurality of masks corresponding to the plurality of third data segments.

19. The method of claim 18, wherein each of the first operation and the second operation comprises an exclusive or (XOR) operation.

20. The method of claim 17, further comprising:
- combining the reconstructed plurality of second data segments into reconstructed second bit data; and
- outputting the reconstructed second bit data.

* * * * *